(12) United States Patent
Murata

(10) Patent No.: US 7,166,921 B2
(45) Date of Patent: Jan. 23, 2007

(54) ALUMINUM ALLOY FILM FOR WIRING AND SPUTTER TARGET MATERIAL FOR FORMING THE FILM

(75) Inventor: Hideo Murata, Saihaku (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 10/976,837

(22) Filed: Nov. 1, 2004

(65) Prior Publication Data

US 2005/0118811 A1 Jun. 2, 2005

(30) Foreign Application Priority Data

Nov. 20, 2003 (JP) .............................. 2003-390636

(51) Int. Cl.
*H01L 23/48* (2006.01)
(52) U.S. Cl. .................. 257/741; 257/765; 257/766; 257/771; 257/E23.011; 204/298.13
(58) Field of Classification Search ............... 257/741, 257/765, 766, 771; 204/298.13
See application file for complete search history.

(56) References Cited

U.S. PATENT DOCUMENTS 5,906,717 A * 5/1999 Hasegawa et al. ..... 204/298.13

FOREIGN PATENT DOCUMENTS

| JP | 07-045555 | 2/1995 |
| JP | 2000-082210 A | 3/2000 |
| JP | 2001-350159 | 12/2001 |

* cited by examiner

*Primary Examiner*—Zandra V. Smith
*Assistant Examiner*—Christy Novacek
(74) *Attorney, Agent, or Firm*—Sughrue Mion, PLLC

(57) ABSTRACT

Disclosed is an Al alloy film for wiring, which consists of, by atom, 0.2 to 1.5% Ge and 0.2 to 2.5% Ni and the balance being essentially Al, wherein a total amount of Ge and Ni is not more than 3.0%. The invention is also directed to a sputter target material having the same chemical composition as that of the Al alloy film.

4 Claims, 3 Drawing Sheets

FIG. 1A
FIG. 1B
FIG. 1C
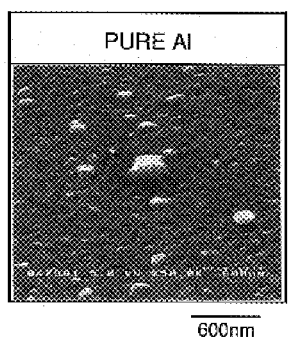
PURE Al
600nm
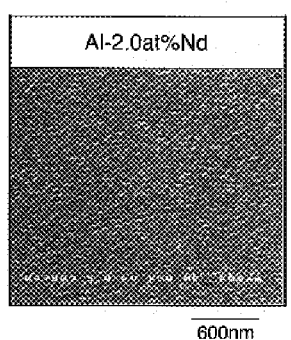
Al-2.0at%Nd
600nm
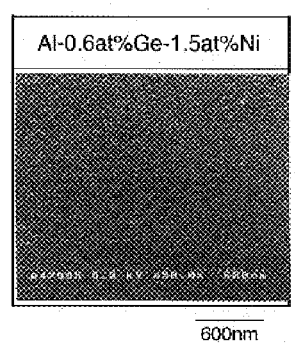
Al-0.6at%Ge-1.5at%Ni
600nm 600nm 600nm

ALUMINUM ALLOY FILM FOR WIRING AND SPUTTER TARGET MATERIAL FOR FORMING THE FILM

BACKGROUND ART

The present invention relates to a film for wiring, and a sputter target material for forming the film, wherein the film is applied to a flat panel display (hereinafter referred to as "FPD") or the like, which is produced by forming a thin film on a substrate.

With regard to the FPD which is fabricated by laminating a thin film on a glass substrate or a silicon wafer, for example, various new products of the FPD have been keenly researched and developed in these days, which include liquid crystal displays (hereinafter referred to as "LCD"), plasma display panels (hereinafter referred to as "PDP"), field emission displays (hereinafter referred to as "FED"), electroluminescence displays (hereinafter referred to as "ELD") and electronic papers.

There have been used transparent conductive films of ITO (Indium-Tin-Oxide) as the wiring film for the FPDs, optionally with display electrodes of ITO in the case where a high definition display is required, or other wiring films for the FPDs, which are made of a refractory metal of Cr, Mo or an alloy thereof having a low electrical resistance and being excellent in adhesiveness to substrates. Further, recently, there have been used lower resistance wiring films made of Al or Al alloy films under the background that liquid crystal TVs having a size of 15 inches require high speed driving in order to display moving images.

One defect of Al is poor in heat resistance property. When an Al film for wiring is heated in a manufacturing process of FPD or other various devices, there occur hillocks and/or whiskers caused by stress relief resulting in occurrence of short circuit or defects in protective films. Thus, it has been tried to restrain occurrence of hillocks and so on by various means of, for example, adding an alloying element to Al to make an Al alloy film, or coating an Al film with another metal film (see, for example, JP-2733006-B2 and JP-A-2001-350159.

On the other hand, with respect to displays for small portable devices and so on, hereafter, it will be needed to provide films for wiring which have lower electrical resistance and can be produced under a lower processing temperature, since there have been used resin substrates, resin films and so on in place of glass substrates, etc., in order to improve shock-resistance property and more lighten the devices.

Furthermore, in order to realize a high definition display such as a high definition TV with utilization of a big size LCD having a size of more than 30 or more than 50 inches or an organic ELD, and also improved high speed responsibility for moving images, a film for wiring having lower electrical resistance is required.

BRIEF SUMMARY OF THE INVENTION

According to the prior art mentioned above, various Al alloy films, containing one or more of additive alloying elements in order to improve heat resistance property, have been proposed, which are subjected to a manufacturing process including a high temperature heat treatment so as to have low electrical resistance.

For example, a conventional Al—Nd alloy film, consisting of 2 atomic % Nd and the balance of Al, shown in JP-2733006-B2, has resistivity of 16 μΩcm as formed state on a substrate at room temperature, which is inferior than refractory metal Mo having resistivity of around 12 μΩcm. The resistivity of the Al—Nd film decreases abruptly by heat treatment, possibly, to around 6 μΩcm by heat treatment at a temperature of not lower than 350° C. As stated above, the conventional Al alloy films contain one or more additive alloying elements which are selected on condition that they are subjected to heat treatment in a manufacturing process thereof thereby intending to have improved heat resistance and decreased electrical resistance of the Al alloy films.

Thus, it is hard to provide with lower electrical resistance to the conventional Al alloy films formed on a substrate made of resin, for example, which cannot bear satisfactory heat treatment. Further, since it is necessary to design a manufacturing process taking a heating process into consideration, a degree of freedom in such designing is small, thus making the conventional Al alloy films hard to be applied simply to various FPDs. There is also a problem in the conventional Al alloy films that the electrical resistance thereof changes greatly depending upon a heating temperature.

In addition, the conventional Al—Nd alloy film has a problem of reliability because there is a possibility of line breaks in the case of minute wiring produced from the above film. The present inventors are not sure but such a defect would be due to volumetric shrinkage of the Al—Nd alloy film during heat treatment. Thus, the Al—Nd alloy film has a problem of difficulty in applying it to displays such as those installed in motor vehicles or incorporated to observation devices which are exposed to a severe atmosphere in which the temperature varies repeatedly over a broad temperature range from a low degree to a high degree.

Accordingly, an object of the present invention is to provide an Al alloy film for wiring, which has lower electrical resistance and high reliability, and which is applicable to high definition TVs having a big size and various FPDs manufactured under a low processing temperature, and a sputter target material for forming the Al alloy film.

The present inventors have researched and examined various Al alloy compositions and found that an Al alloy film containing specific amounts of Ni and Ge is excellent in heat resistance property, and has low electrical resistance and high reliability which properties are important to a film for wiring, whereby achieving the present invention.

According to a first aspect of the invention, there is provided an Al alloy film for wiring, which consists of, by atom, 0.2 to 1.5% of Ge, 0.2 to 2.5% of Ni and the balance essentially of Al, wherein a total amount of Ge and Ni is not more than 3.0%.

Preferably, the Al alloy film consists of, by atom %, 0.2 to 0.8% of Ge, 1.0 to 2.0% of Ni and the balance essentially of Al, wherein a total amount of Ge and Ni is not more than 2.5%.

According to a second aspect of the invention, there is provided a sputter target material for forming a film for wiring, which consists of, by atom, 0.2 to 1.5% of Ge, 0.2 to 2.5% of Ni and the balance essentially of Al, wherein a total amount of Ge and Ni is not more than 3.0%.

Preferably, the sputter target material consists of, by atom, 0.2 to 0.8% of Ge, 1.0 to 2.0% of Ni and the balance essentially of Al, wherein a total amount of Ge and Ni is not more than 2.5%.

The invention is directed to the Al alloy film having low electric resistance, high reliability and excellent heat resistance property, and being effectively applicable to the wiring film for FPDs, such as big size liquid TVs or electronic papers, which wiring film is required to have further lower electrical resistance hereafter. The invention Al alloy film for wiring is formed optimally by sputtering with utilization of the target material, since a film, having generally the same chemical composition as that of the target material, can be formed stably by sputtering on a substrate having a large surface area for FPDs.

BRIEF DESCRIPTION OF THE DRAWINGS

FIGS. 1A to 1E are of photographs based on a field emission-type scanning electron microscope (FE-SEM) by a magnification of 50,000, which show surface states of invention and comparative films after heat treatment at a temperature of 250° C.;

DETAILED DESCRIPTION

Figure 1D:
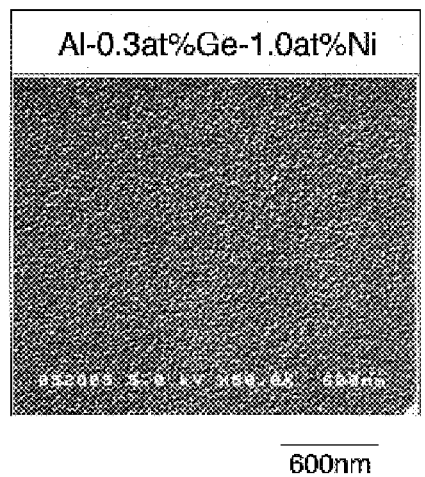
Figure 1E:
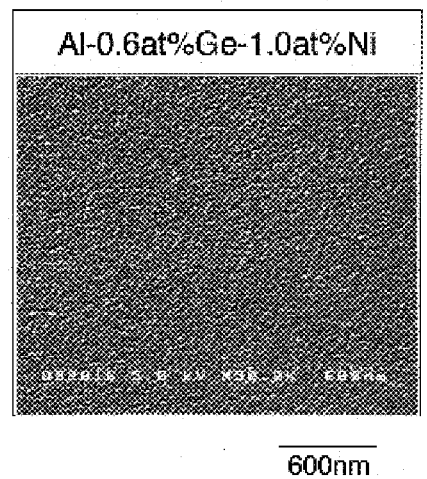

A key aspect of the invention is finding of the Al alloy film which is produced by adding a combination of Ge and Ni to Al so as to have an optimum alloy composition in order to satisfy the requirements to the wiring film for electronic components, such as FPDs, which are lower electrical resistance, excellent heat resistance, formability of patterns, high reliability in restraining line breaks.

Herein below there will be described about reasons why the additive alloying elements of Ge and Ni are preferred for the Al alloy wiring film, and why the specific additive amounts thereof are determined.

Effects of Ge as an additive to Al are to restrain occurrence of migration of the Al alloy film when heating thereby improving heat resistance property of the Al alloy film, and to be capable of improving the corrosion resistance of the same. Although it is not so clear about reasons why such effects can be obtained, the present inventors presume as follows:

In general, a typical method of forming a metal film, used in displays and so on, is the sputtering process. When a thin film is formed on a substrate by sputtering, additive elements are dissolved in the Al matrix in a nonequilibrium state. The element of Ge, which has a maximum solid solubility of approximately 2. atomic % in Al at about 400° C., is dissolved in Al to change properties of Al itself thereby restraining migration of Al. Further, since dissolved Ge in Al prevents intergranular corrosion, there can be improved the resistance to corrosion of the Al alloy film by chemical liquids and the like used in the production process of displays and so on, whereby the Al alloy film having high reliability can be obtained.

The heat resistance property of the Al alloy film is further improved by an additive Ni. Regarding the Ni effect, the present inventors presume as follows:

Since Ni is an element which forms intermetallic compounds with Al and Ge, it prevents Al and Ge from atomic movement thereof, whereby causing the Al alloy film to have a fine and dense metal structure, and to reduce voids in the film.

In the case where the Al alloy film is subjected to heat treatment, Al atoms are prevented from movement by virtue of Ni, which forms an inter-metallic compound with Al, and Ge which is dissolved in an Al matrix. Further, an Al—Ge—Ni alloy is caused to become a nearly equilibrium state by heat treatment, whereby Ge, which has a low solubility in Al at a low temperature zone, is separated from the Al matrix and likely to form an intermetallic compound of Ni—Ge and a complex intermetallic compound of Al—Ni—Ge. The intermetallic compounds tend to precipitate at grain boundaries and on a film surface, whereby restraining growth of Al grains and occurrence of hillocks, so that the Al alloy film can have excellent heat resistance property.

The above effects are not satisfactory in the case of less than 0.2 atomic % of Ge. But the more the Ge amount is, the higher the electrical resistance of the Al alloy film becomes. Thus, the Ge amount is preferably in a range of 0.2 to 1.5 atomic %.

The effects of the additive Ni are not satisfactory in the case of less than 0.2 atomic % of Ni. The more the Ni amount is, the more the Ni effects increase. However, if the Ni amount exceeds 2.5 atomic %, the low electrical resistance of the Al alloy film cannot be maintained.

In order to obtain excellent heat resistance property, high reliability and lower electrical resistance of the Al—Ge—Ni alloy film, preferably a total amount of Ge and Ni is not more than 3.0 atomic %.

Further, in order to satisfy the requirements of keeping the most desirable property of lower electrical resistance, heat resistance property and high reliability as the film for wiring, the additive amounts of Ge and Ni are determined to be 0.2 to 0.8 atomic % and 1.0 to 2.0 atomic %, respectively, and not more than 2.5 atomic % in total.

The invention Al alloy film is capable of forming stably a width of wiring because of a fine metal structure thereof, when conducting wet etching with utilization of a chemical liquid in order to form a wiring pattern. Noted is that any low evaporative substances are not produced when Ge and Ni, especially specified in the present invention, react a halogen in an etching gas during dry etching. Thus, when the invention Al alloy film is subjected to dry etching, residues are hard to occur whereby capable of using the dry etching process according to which a fine and precise wiring pattern can be produced.

On the other hand, it is possible to maintain electrical contact between the invention Al alloy film and an ITO (Indium-Tin-Oxide) film, which serves as pixel electrodes in FPDs such as LCDs even after photoetching in a manufacturing process thereof. With regard to a conventional pure Al or Al—Nd alloy film (hereinafter referred to as "Al-based film"), there has been formed a barrier film made of Cr, Mo, Ti, etc. between the ITO film and the Al-based film taking account of an unfavorable phenomenon that an Al oxide is formed at an interface between the ITO film and the Al-based film thereby preventing the contact of the both films due to a corrosion cell reaction during photoetching.

In the invention Al alloy film, it is possible to restrain the corrosion cell reaction at the contact interface between the ITO film and the Al alloy film thereby keeping electrical contact between the both films, because the invention film of the Al alloy contains Ni, which has an effect of raising electrode potential of Al, and Ge which is separated from Al and promotes Ni to move toward the contact interface, whereby realizing wiring or electrodes without the barrier film of Cr, Mo, Ti, etc. conventionally formed between the ITO film and the Al system film. In this case, in order to maintain the electrical contact between the ITO film and the Al alloy film, and the low electrical resistance of the latter film, it is preferable to set the Ge and Ni amounts such that 0.2 to 0.8 atomic % Ge and 1.0 to 2.0 atomic % Ni, and a total amount thereof being not more than 2.5 atomic %.

It is possible to raise Si as an additive alloying element to the Al alloy, by which generally the same effects as Ge are expectable, but it unfavorably raises electrical resistance of an Al alloy, and is inferior in heat resistance and corrosion resistance properties. Thus, Ge is the most preferable for the Al alloy film.

It is also possible to raise Co, Fe, Pd and Pt as an additive alloying element to the Al alloy, by which generally the same effects as Ni is expectable. However, Co and Fe unfavorably increases electrical resistance of the Al alloy film in comparison with Ni. On the other hand, Pd and Pt are expensive metals. Thus, Ni is the most preferable element when incorporated with Ge in order to produce an Al alloy film having excellent properties as the film for wiring.

According to the invention Al alloy film by which defects of Al are improved, it is possible to easily realize a low electrical resistance of not more than 12 µΩcm by resistivity in a state as formed by adding as small as possible amounts of Ge and Ni in Al, so that the Al alloy film is suitably used as the film for wiring.

Glass substrates and silicon wafers are suitably used as substrates for forming the invention Al alloy film. These substrates are excellent in stability of the process of manufacturing the displays. By heating the substrate when forming the invention Al alloy film, it is possible to obtain the Al alloy film having lower electrical resistance than that of the same film formed on the substrate at room temperature.

The invention Al alloy film has low electrical resistance even if it is in a state as formed. Thus, it is suitable as the wiring film in sheet or flexible displays, for example, which devices are formed on resin substrates which cannot be subjected to enough heating.

On the other hand, the invention Al alloy film for wiring is optimally formed by sputtering with utilization of a sputter target material for forming the Al alloy film, which has the same chemical composition as the invention wiring film. According to the sputtering process, it is possible to form a film having generally the same chemical composition as a target material, whereby the invention Al alloy film can be formed stably.

While there have been various methods of producing a sputter target material, any method may be used for producing the invention Al alloy film, if it is possible to attain the sputter target material having high purity, high density and a uniform metal structure which are usually required thereto. The sputter target material is produced as follows, for example:

An alloy having a predetermined chemical composition is melted in a vacuum melting furnace, cast in a metallic mold, processed to a plate by plastic forming such as forging, rolling and so on, and subsequently machined to an objective sputter target material having a predetermined form. An ingot, which is prepared by powder sintering or rapidly solidified by spray forming (i.e. a droplet deposition method), may be also used in order to obtain a uniform structure of the sputter target material.

While the invention sputter target material for forming the Al alloy film used in displays comprises a base component, being substantially Al, other than the additive elements, it may contain unavoidable impurities including oxygen, nitrogen and carbon which are gaseous components without impairing the advantageous effects of the invention. The amounts of gaseous components of oxygen, nitrogen and carbon are preferably not more than 50 ppm, respectively. Preferably, the invention sputter target material has a purity of not less than 99.9% except for the gaseous components.

While the substrate used for producing displays are suitably glass substrates, silicon wafers and so on, it may be other materials from which a thin film can be formed by sputtering, the other materials being resin substrates, insulated metal substrates, resin foils and metal foils for example.

The invention Al alloy film preferably has a thickness of 100 to 300 nm in order to obtain stable properties thereof. If the Al alloy film has a thickness of less than 100 nm, since the thickness of the film is thin, an influence of surface scattering of the Al alloy film increases resulting in that the electrical resistance of the film is liable to increase. On the other hand, if the thickness of the film exceeds 300 nm, crystal grains of the film grow to increase an unevenness of the film surface state, whereby a smoothness of the film cannot be maintained resulting in that the film is liable to be delaminated due to stress therein and a processing time needed to form the film is prolonged thereby reducing the productivity.

The other features of the present invention will be clearly understood from the following examples, although the examples of course put no restrictions on a scope of the present invention.

EXAMPLE 1

A plurality of Al alloy target materials as specimens were prepared as follows:

Raw materials were compounded to prepare a respective specimen material which has substantially the same chemical composition as an objective chemical composition of an Al alloy film consisting of additive alloying elements and Al, melted in a vacuum melting furnace, and cast into a mold to obtain an ingot. The ingot was subjected to plastic working to form a plate which was machined to prepare a sputter target material as one specimen having a diameter of 100 mm and a thickness of 5 mm.

Also the other specimens, each of which has a different chemical composition from the above specimen, were prepared by the same manner as stated above. A specimen of pure aluminum was prepared also by generally the same manner as stated above.

A pure Al film and Al alloy films, each having a thickness of 200 nm, were formed on smooth glass substrates by sputtering, respectively, each having a size of 100 mm×100 mm. Thereafter, resistivity of the respective specimen film was measured by means of a four-probe method. The measurement results are shown in Table 1.

In order to assess a property change of the respective film after necessary manufacturing process for a display with the film, a heat resistance test was conducted for the film.

At first, the respective film was subjected to a heat treatment under the atmosphere at a temperature of 250° C. for one hour, and subsequently its resistivity was measured. Thereafter, the respective substrate with the film was cut so as to have a size of 10 mm×10 mm. A surface of the respective film was observed by a field emission-type scanning electron microscope (FE-SEM), with magnification of 50,000, at a view angle of 45 degrees to the film surface in order to confirm a state of occurred projections such as hillocks at every 10 points in an observation field of 2.5 µm×2.5 µm. A result of the observation on the respective film was evaluated by determining whether hillocks occurred. When hillocks were not present, an evaluation result was regarded as "good" with a letter "A". When hillocks were present, an evaluation result was regarded as "bad" with a letter "B". Those results are shown in Table 1 together with "resistivity" of the respective film after heat treatment.

TABLE 1

| Specimen No. | Chemical composition (atomic %) | Resistivity (μΩcm) as formed | Resistivity (μΩcm) after heat treatment | Evaluation of surface | Note |
|---|---|---|---|---|---|
| 1 | Al | 3.9 | 3.7 | B | Comparative specimen |
| 2 | Al-2.0Nd | 16.4 | 7.3 | A | Comparative specimen |
| 3 | Al-0.1Ge-1.5Ni | 6.8 | 4.0 | B | Comparative specimen |
| 4 | Al-0.2Ge-1.5Ni | 7.6 | 4.2 | A | Invention specimen |
| 5 | Al-0.6Ge-1.5Ni | 8.8 | 4.8 | A | Invention specimen |
| 6 | Al-1.0Ge-1.5Ni | 9.3 | 5.4 | A | Invention specimen |
| 7 | Al-1.5Ge-1.5Ni | 12.0 | 5.8 | A | Invention specimen |
| 8 | Al-2.0Ge-1.5Ni | 13.7 | 6.3 | A | Comparative specimen |
| 9 | Al-0.6Ge-2.0Ni | 10.5 | 5.1 | A | Invention specimen |
| 10 | Al-0.6Ge-1.0Ni | 7.9 | 4.8 | A | Invention specimen |
| 11 | Al-0.6Ge-0.5Ni | 6.3 | 4.8 | A | Invention specimen |
| 12 | Al-0.6Ge-0.1Ni | 5.4 | 4.9 | B | Comparative specimen |
| 13 | Al-0.4Ge-2.5Ni | 12.0 | 5.7 | A | Invention specimen |
| 14 | Al-1.8Ge-1.0Ni | 14.5 | 7.8 | A | Comparative specimen |
| 15 | Al-1.0Si-1.5Ni | 13.0 | 7.0 | B | Comparative specimen |
| 16 | Al-1.0Ge-1.5Co | 15.3 | 7.6 | A | Comparative specimen |
| 17 | Al-1.0Ga-1.5Ni | 16.2 | 8.9 | A | Comparative specimen |
| 18 | Al-0.3Ge-1.0Ni | 7.1 | 4.9 | A | Invention specimen |

FIGS. 1A to 1E are of photographs showing the film surfaces of the following specimen films observed by a field emission-type scanning electron microscope (FE-SEM): a pure Al film (Specimen No. 1), an Al-2% Nd film (Specimen No. 2), an Al-0.6% Ge-1.5% Ni film (Specimen No. 5), an Al-0.6% Ge-1.0% Ni film (Specimen No. 10) and an Al-0.3% Ge-1.0% Ni film (Specimen No. 18).

Many hillocks were present as large projections on a surface of the pure Al film. The Al-2% Nd film and the Al-0.6% Ge-1.5% Ni film were of good surfaces free from hillocks.

Any of the Al-0.6% Ge-1.5% Ni film, the Al-0.6% Ge-1.0% Ni film and the Al-0.3% Ge-1.0% Ni film had grain size finer than the Al-2% Nd film, and its smoothness was superior to the Al-2% Nd film. The fine grain size and the smooth surface prove that the invention Al alloy film has excellent heat-resistance.

Figure 3A:
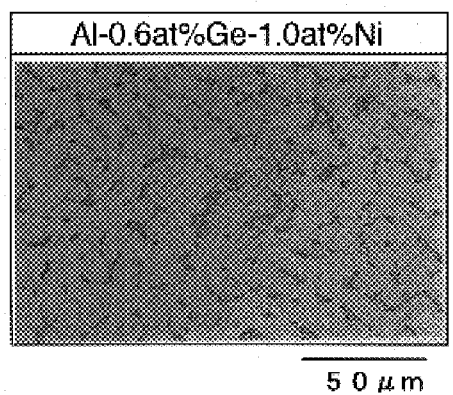
FIGS. 3A and 3B are of photographs based on an optical microscope, which show microstructures of two sputter target materials as invention specimens.
Figure 3B:
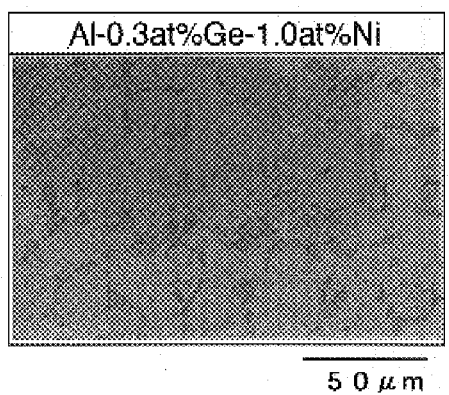

Surface structures of an Al-0.6% Ge-1.0% Ni sputter target (Specimen No. 10) and an Al-0.3% Ge-1.0% Ni (Specimen No. 18), observed by an optical microscope, are shown in FIG. 3.

It is understood from the results in Table 1 and FIGS. 1A to 1E that hillocks, i.e. large projections, are formed on a surface of the pure Al film after heat treatment, although the pure Al film has low resistivity. The Al-2% Nd film is free from hillocks, but its resistivity is high.

On the other hand, any of the invention Al alloy films, which contain both Ge and Ni therein, has low resistivity of not more than 12 μΩcm in an as formed state and not more than 6 μΩcm after heat treatment, and has excellent heat resistance property. It can be understood from evaluation results of Specimen Nos. 3 to 14 that, in the case of small amounts of additive Ge and Ni, the effect of restraining hillocks is not satisfactory, and in the case where a total additive amount of Ge and Ni exceeds 3.0 atomic %, the resistivity of the film becomes high.

EXAMPLE 2

Each of pure Al and Al alloy films, shown in Table 2, was examined by the following reliability test, on the presumption that a display with the pure Al or Al alloy film was operated for a long while.

Figure 2:
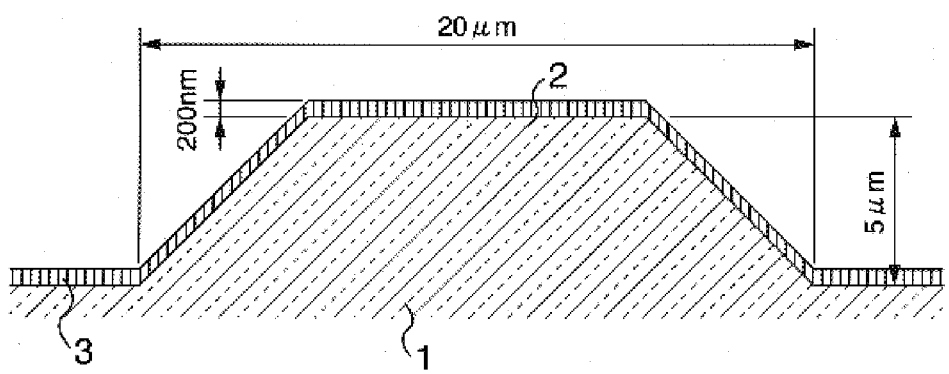
FIG. 2 is a schematic cross-sectional view of a glass substrate with a protrusion according to Example 2.

For the reliability test, a glass substrate 1 of 100 mm×100 mm in size was processed to a profile, wherein protrusions 2 of 20 μm in width and 5 μm in height with an inclination angle of 45 degrees (see FIG. 2) were formed in intervals of 200 μm.

A pure Al or Al alloy film 3 of 200 nm in thickness was formed on the glass substrate 1 with the protrusions 2 by sputtering with utilization of a sputter target material, shown in Table 2, which were selected from target materials in Example 1.

Thereafter, the pure Al or Al alloy film 3 was processed to 9 blocks (30 mm×30 mm) of striped patterns, by a photoetching process with utilization of a mixed solution of phosphoric, nitric and acetic acids. Each block was composed of an element, which had every 25 stripes with widths 5 μm, 10 μm, 20 μm and 30 μm (100 stripes in total), and each stripe crossed perpendicularly the protrusions 2 on the glass substrate 1.

A silicon oxide layer was formed as a protection coating of 3 μm in thickness on the pure Al or Al alloy film by sputtering, and a polyimide film of 3 μm in thickness was further applied thereto by a spin coating process. The polyimide film was cured at 350° C. in a nitrogen atmosphere.

One block having the above pattern was separately cut off the glass substrate 1. A potential of 5V was applied to both ends of the striped pure Al or Al alloy film on the separated block. After the separated block was left as such for 300 hours in a high-temperature humid atmosphere at 60° C. and 80% humidity, the resistivity and the number of line breaks were measured.

Table 2 shows measurement results, which represent frequency of line breaks and corrosion-resistance of the pure Al or Al alloy film.

TABLE 2

| Specimen No. | Chemical composition (atomic %) | Evaluation of reliability | | Note |
|---|---|---|---|---|
| | | Corrosion (yes/no) | Frequency of line breaks (%) | |
| 1 | Al | yes | 10 | Comparative specimen |
| 2 | Al-2.0Nd | no | 14 | Comparative specimen |
| 3 | Al-0.1Ge-1.5Ni | no | 7 | Comparative specimen |
| 5 | Al-0.6Ge-1.5Ni | no | 3 | Invention specimen |
| 6 | Al-1.0Ge-1.5Ni | no | 2 | Invention specimen |
| 10 | Al-0.6Ge-1.0Ni | no | 2 | Invention specimen |
| 11 | Al-0.6Ge-0.5Ni | no | 3 | Invention specimen |
| 12 | Al-0.6Ge-0.1Ni | yes | 9 | Comparative specimen |
| 18 | Al-0.3Ga-1.0Ni | no | 3 | Invention specimen |

It is noted from results in Table 2 that with regard to the pure Al film, there occurred corrosion and line breaks due to poor corrosion resistance. Regarding the Al-2% Nd film, there was not corrosion but occurred line breaks so often in comparison with the pure Al film. Due to line breaks, the Al-2% Nd film is evaluated as a film with poor reliability.

On the other hand, any of the invention Al alloy films (Specimen Nos. 5, 6, 11 and 18), formed from sputter target materials containing both Ge and Ni, was evaluated as a high-quality film without corrosion or line breaks. In addition, results of Specimen Nos. 3 and 12 prove that shortage of Ge and Ni leads to line breaks and corrosion.

EXAMPLE 3

Figure 4:
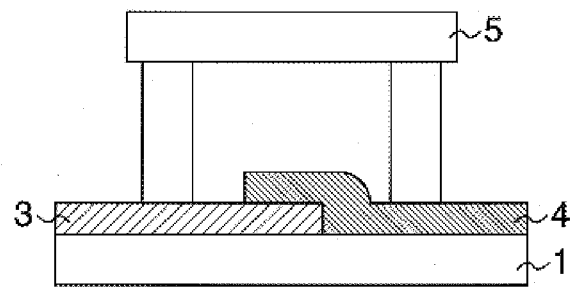
FIG. 4 is a schematic cross-sectional view of a film-layered patterned-film structure in Example 3, by which a contact property of a pure Al film and Al alloy films with an ITO film was evaluated.

Pure Al and Al alloy films, shown in Table 3, were examined for evaluation of electric contact with an ITO film, as follows:

Referring to FIG. 4, a pure Al or Al alloy film 3 of 200 nm in thickness was formed on a smooth surface of a glass substrate 1 of 25 mm×50 mm in size by sputtering and etched to a striped pattern with width of 5 mm. An ITO film 4 of 200 nm in thickness was formed and partially overlaid on the patterned pure Al or Al alloy film 3 by sputtering with utilization of a mask, whereby preparing a film-layered patterned film structure.

Contact electric-resistance between the pure Al or Al alloy film 3 and the ITO film 4 of the film-layered patterned film structure was measured by a four-probe device 5 and evaluated as a contact property of the pure Al or Al alloy film with the ITO film 4.

Further, the film-layered patterned film structure was immersed in an alkaline developer NMD-3 (offered by Tokyo Ohka Co., Ltd.) for 60 seconds, and contact electric-resistance between the pure Al or Al alloy film 3 and the ITO film 4 was measured again by the same probe.

Table 3 shows measurement results of contact electric-resistance before and after immersion in the developer. The term of "unmeasurable" in Table 3 means that there was not electrical connection in the film-layered patterned film.

TABLE 3

| Specimen No. | Chemical composition (atomic %) | Contact electric-resistance | | Note |
|---|---|---|---|---|
| | | as formed ($\Omega$) | after immersion in developer ($\Omega$) | |
| 1 | Al | 16.7 | unmeasurable | Comparative specimen |
| 2 | Al-2.0Nd | 27.5 | unmeasurable | Comparative specimen |
| 5 | Al-0.6Ge-1.5Ni | 20.8 | 21.8 | Invention specimen |
| 10 | Al-0.6Ge-1.0Ni | 20.0 | 21.8 | Invention specimen |
| 18 | Al-0.3Ga-1.0Ni | 19.7 | 20.6 | Invention specimen |

It is noted from the results shown in Table 3 that with regard to the pure Al and Al—Nd films after photoetching, no electrical connection could be obtained, while the invention Al alloy film preserves electrical connection even after photoetching.

The invention claimed is:

1. An Al alloy film for wiring, which consists of, by atom %, 0.2 to 1.5% of Ge, 0.2 to 2.5% of Ni and the balance essentially of Al, wherein a total amount of Ge and Ni is not more than 3.0%.

2. An Al alloy film according to claim 1, which consists of, by atom %, 0.2 to 0.8% of Ge, 1.0 to 2.0% of Ni and the balance essentially of Al, wherein a total amount of Ge and Ni is not more than 2.5%.

3. A sputter target material for forming a film for wiring, which consists of, by atom %, 0.2 to 1.5% of Ge, 0.2 to 2.5% of Ni and the balance essentially of Al, wherein a total amount of Ge and Ni is not more than 3.0%.

4. A sputter target material according to claim 3, which consists of, by atom %, 0.2 to 0.8% of Ge, 1.0 to 2.0% of Ni and the balance essentially of Al, wherein a total amount of Ge and Ni is not more than 2.5%.

* * * * *